United States Patent
Choi et al.

(10) Patent No.: US 7,505,278 B2
(45) Date of Patent: Mar. 17, 2009

(54) DISPLAY MODULE AND APPARATUS FOR MOBILE COMMUNICATION HAVING THE SAME

(75) Inventors: Byung Sung Choi, Gyeonggi-do (KR); Hyoung Seok Kim, Gyeonggi-do (KR); Sang Ki Hong, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 11/649,755

(22) Filed: Jan. 5, 2007

(65) Prior Publication Data
US 2008/0062661 A1 Mar. 13, 2008

(30) Foreign Application Priority Data
Sep. 11, 2006 (KR) ............ 10-2006-0087584
Nov. 16, 2006 (KR) ............ 10-2006-0113335

(51) Int. Cl.
*H05K 1/00* (2006.01)
(52) U.S. Cl. ............ 361/749; 361/752; 174/71
(58) Field of Classification Search ............ 455/575.1, 455/575.3, 575.4; 361/749, 752; 174/71
See application file for complete search history.

(56) References Cited

U.S. PATENT DOCUMENTS

| | | | |
|---|---|---|---|
| 5,448,020 A | | 9/1995 | Pendse |
| 7,158,817 B2 * | | 1/2007 | Kubo ............ 455/575.3 |
| 7,248,903 B2 * | | 7/2007 | Yoda ............ 455/575.1 |
| 2005/0255897 A1 * | | 11/2005 | Lee et al. ............ 455/575.4 |
| 2006/0040520 A1 * | | 2/2006 | Moh ............ 439/66 |
| 2006/0065426 A1 * | | 3/2006 | Anderson ............ 174/71 R |
| 2006/0114646 A1 | | 6/2006 | Koibuchi et al. |

FOREIGN PATENT DOCUMENTS

| | | |
|---|---|---|
| JP | 07-111371 A | 10/1993 |
| JP | 2004-095566 A | 3/2004 |

* cited by examiner

*Primary Examiner*—Dean A. Reichard
*Assistant Examiner*—Andargie M Aychillhum
(74) *Attorney, Agent, or Firm*—Birch, Stewart, Kolasch & Birch, LLP

(57) ABSTRACT

A display assembly having a display module to receive a display signal containing prescribed information, a main circuitry supporting substrate including a ground, a flexible circuitry supporting substrate module connected to the circuitry supporting substrate to process or transfer data for prescribed information from the circuit board to the display module, the flexible circuitry supporting substrate module having recessed conductive portions, and a conductive member connected to the flexible circuitry supporting substrate module to ground the flexible circuitry supporting substrate and the display module, the conductive member including conductive tape applied to the flexible circuitry supporting substrate module and conductive paste to connect recessed conductive portions of the flexible circuitry supporting substrate module to the conductive tape. The display assembly may be formed in a mobile terminal.

19 Claims, 8 Drawing Sheets

DISPLAY MODULE AND APPARATUS FOR MOBILE COMMUNICATION HAVING THE SAME

CROSS REFERENCE TO RELATED APPLICATIONS

This application claims the benefit of Korean Patent Application No. 10-2006-0087584 filed on Sep. 11, 2006, and Korean Patent Application No. 10-2006-0113335 filed on Nov. 16, 2006, both of which are herein incorporated by reference.

BACKGROUND OF THE INVENTION

1. Field of the Invention

The present invention relates to a circuit board module, display module and mobile terminal incorporating the same. Although the present invention is suitable for a wide scope of applications, it is particularly suitable for maximizing a ground area of a circuit board, display module or the like vulnerable to static electricity.

2. Description of Related Art

Generally, an apparatus for mobile communication is a mobile terminal, such as a mobile phone, a PDA and the like. The mobile terminal, which is portable, enables a user to exchange various kinds of information such as pictures, voices, characters and the like with a correspondent user via wireless communications or receive various services by accessing a prescribed server. Mobile terminals, and more particularly, mobile phones have evolved from a bar type to a flip type, a folder type, and a slide type.

Recently, a large-scale liquid crystal display (LCD) window is provided to a mobile terminal to enjoy various multimedia functions as well as a simple voice communication. To meet the consumers' demands for slim, light, portable and convenient terminal, the technology for reducing the slimness of mobile terminals has becomes a core technology in the mobile communication field.

However, since the slimness in mobile terminal puts limitation on sizes of parts loaded in the mobile terminal for mobile communication, static electricity, which is generated within the mobile terminal or introduced from outside, degrades internal parts of the mobile terminal. Moreover, since the internal parts should be reduced in thickness due to the slimness of the mobile terminal, mechanical rigidity becomes considerably vulnerable.

In particular, a LCD or the like is very vulnerable to static electricity. Since a user typically views the LCD to use the mobile terminal, if the LCD is affected by the static electricity, the user will see image distortion or the like. Therefore, it is important to minimize the static electricity influence on the LCD in a manner of maximizing a ground area of the LCD. Yet, it is difficult to secure a sufficient ground area due to the slimness of the apparatus.

In addition, since the mechanical rigidity of the LCD is very poor, it is highly probable that the LCD may be transformed or bent by an external impact or the like. So, to solve theses problems, rigidity of parts including a circuitry supporting substrate within a limited internal space of the apparatus needs to be reinforced and a ground space within a narrow internal space of the apparatus needs to be maximized, simultaneously.

BRIEF SUMMARY OF THE INVENTION

Accordingly, the present invention is directed to a display module and a mobile terminal that substantially obviate one or more problems due to limitations and disadvantages of the related art. For example, an aspect of the present invention is to provide a display module and a mobile terminal having the same, by which internal or external static electricity influence on parts of the apparatus such a display device as an LCD and the like can be minimized and by which the LCD vulnerable to an external force can be reinforced.

According to principles of this invention, the present invention is directed to a display assembly having a display module to receive a display signal containing prescribed information, a main circuitry supporting substrate including a ground, a flexible circuitry supporting substrate module connected to the main circuitry supporting substrate to process or transfer data for prescribed information from the main circuitry supporting substrate to the display module, the flexible circuitry supporting substrate module having recessed conductive portions, and a conductive member connected to the flexible circuitry supporting substrate module to ground the flexible circuitry supporting substrate module and the display module, the conductive member including conductive tape applied to the flexible circuitry supporting substrate module and conductive paste to connect recessed conductive portions of the flexible circuitry supporting substrate module to the conductive tape.

In another aspect, the flexible circuitry supporting substrate module may include a first signal line connectable to the main circuitry supporting substrate, a second signal line connected to the display module, and a signal processing part connected to the first and second signal lines to manage and process signals.

In a further aspect, the flexible circuitry supporting substrate module may include a key input part configured to receive a key input from a keypad, the key input part being connected to the second signal line and the display module to transfer data of the second signal line to the display module, and a reinforcement member connected to the key input part, the reinforcement member being at least partially formed of conductive materials to enable the display module and the flexible circuitry supporting substrate module to be grounded.

In another aspect, the display module may include a connecting circuit part connected to the flexible circuitry supporting substrate module to transfer data for prescribed information and a screen on which the information transferred from the connecting circuit part is displayed. The screen may be a liquid crystal display.

In yet another aspect, the conductive member may include a conductive reinforcement member, wherein the conductive tape attaches the conductive reinforcement member to the conductive paste coated on the flexible circuitry supporting substrate module, and the conductive tape electrically connects the recessed conductive area of the flexible circuitry supporting substrate module and the conductive paste with the conductive reinforcement member.

According to principles of this present invention, the present invention is directed to a mobile terminal including a first body having a main circuitry supporting substrate located therein, a second body performing a relative motion against the first body to open/close the first body, and a display assembly. The display assembly includes a display module to receive a display signal containing prescribed information, a main circuitry supporting substrate including a ground, a flexible circuitry supporting substrate module connected to the main circuitry supporting substrate to process or transfer data for prescribed information from the main circuitry supporting substrate to the display module, the flexible circuitry supporting substrate module having recessed conductive portions, and a conductive member connected to the flexible circuitry supporting substrate module to ground the flexible circuitry supporting substrate module and the display module, the conductive member including conductive tape applied to the flexible circuitry supporting substrate module and conductive paste to connect recessed conductive portions of the flexible circuitry supporting substrate module to the conductive tape.

Further aspects of the mobile terminal may include the various aspects that were described above regarding the display assembly.

According to principles of this present invention, the present invention is directed to a mobile terminal including a first body, a second body configured to open and close the first body; and a circuitry supporting substrate module provided within at least one of the first and second bodies. The circuitry supporting substrate module includes a circuitry supporting substrate having at least one recessed conductive area and a conductive member connected to the circuitry supporting substrate to ground the circuitry supporting substrate. The conductive member includes conductive tape applied to the flexible circuitry supporting substrate module and conductive paste to connect recessed conductive portions of the circuitry supporting substrate to the conductive tape.

In another aspect, the circuitry supporting substrate may be a main circuitry supporting substrate and the mobile terminal may include a display assembly as described above.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

First of all, a circuitry supporting substrate module or a display module according to the present invention is usable for all devices having a circuitry supporting substrate built therein as well as a mobile terminal. In this case, the circuitry supporting substrate may include a printed circuit board or one of all kinds of boards connected to devices processing signals containing prescribed information.

In addition, a mobile terminal according to the present invention is applicable to many different types of mobile terminals including, but not limited to, folder type mobile terminal, a slide type mobile terminal, and a swing type mobile terminal.

Figure 1:
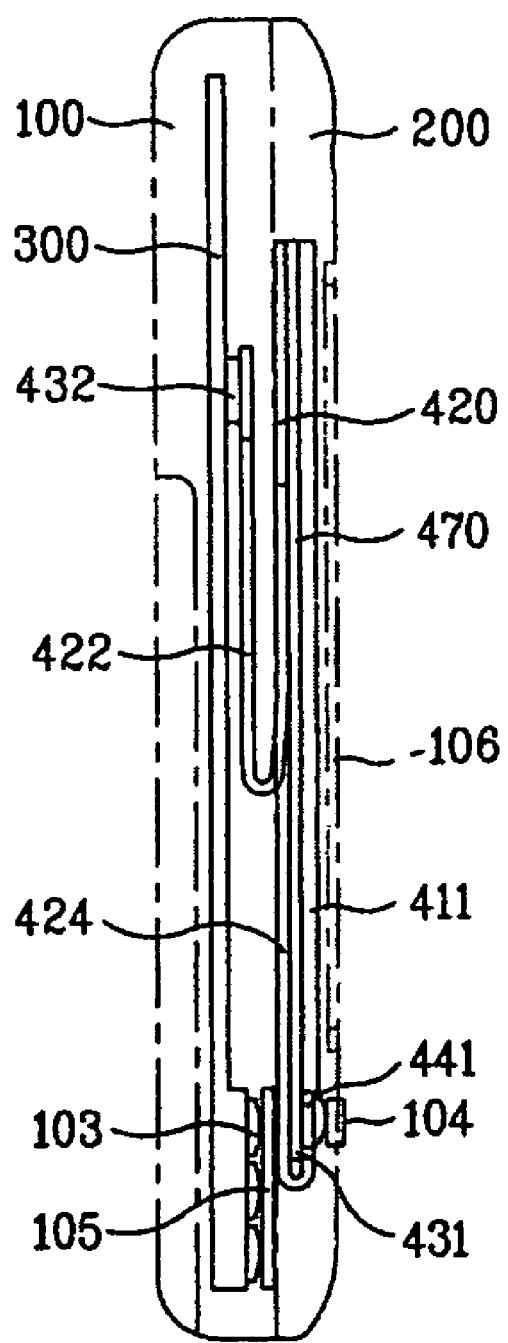
FIG. 1 is a lateral diagram of an apparatus for mobile communication according to the present invention, in which a slide-down state of the apparatus for mobile communication is shown.
Figure 2:
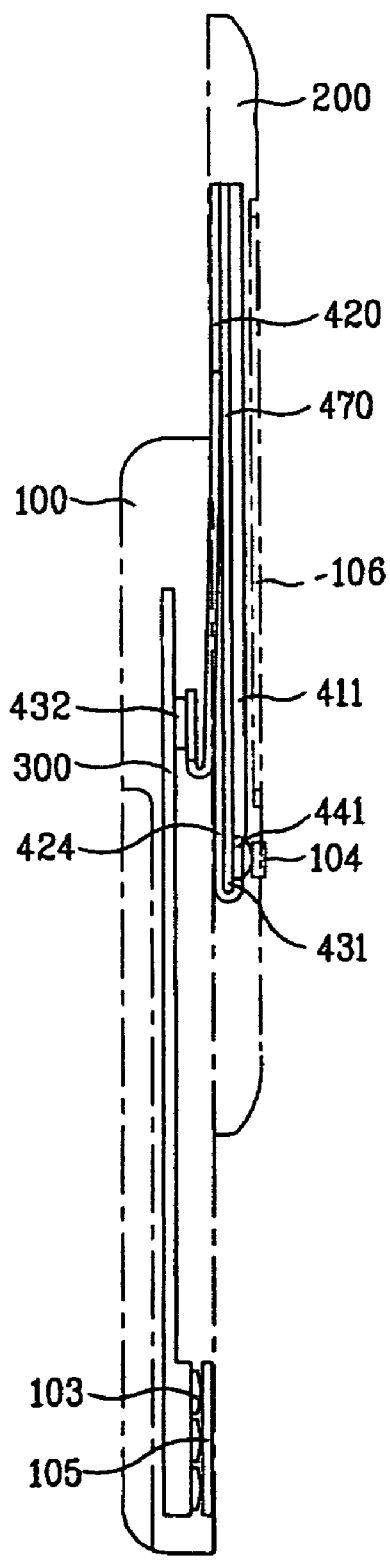
FIG. 2 is a lateral diagram of an apparatus for mobile communication according to the present invention, in which a slide-up state of the apparatus for mobile communication is shown.

Referring to FIG. 1 and FIG. 2, an mobile terminal according to the present invention includes a first body 100 in which a main circuitry supporting substrate module 300 having prescribed parts for mobile communication mounted thereon is provided and a second body 200 opening/closing the first body 100 by performing a relative motion (e.g., a slide, a rotation, a flip, etc.) against the first body 100. A display module 400 is provided within the second body 200. In the present embodiment, a mobile terminal having a slide motion is used as the exemplary embodiment.

In the following description, ground structures of the main circuitry supporting substrate module 300 and the display module 400 are explained with reference to FIGS. 3 to 8. Within the second body 200, the display module represents prescribed information as an image output by receiving a signal containing the prescribed information from the main circuitry supporting substrate 300 and the image output represented by the display module is externally displayed by a window 106.

Figure 3:
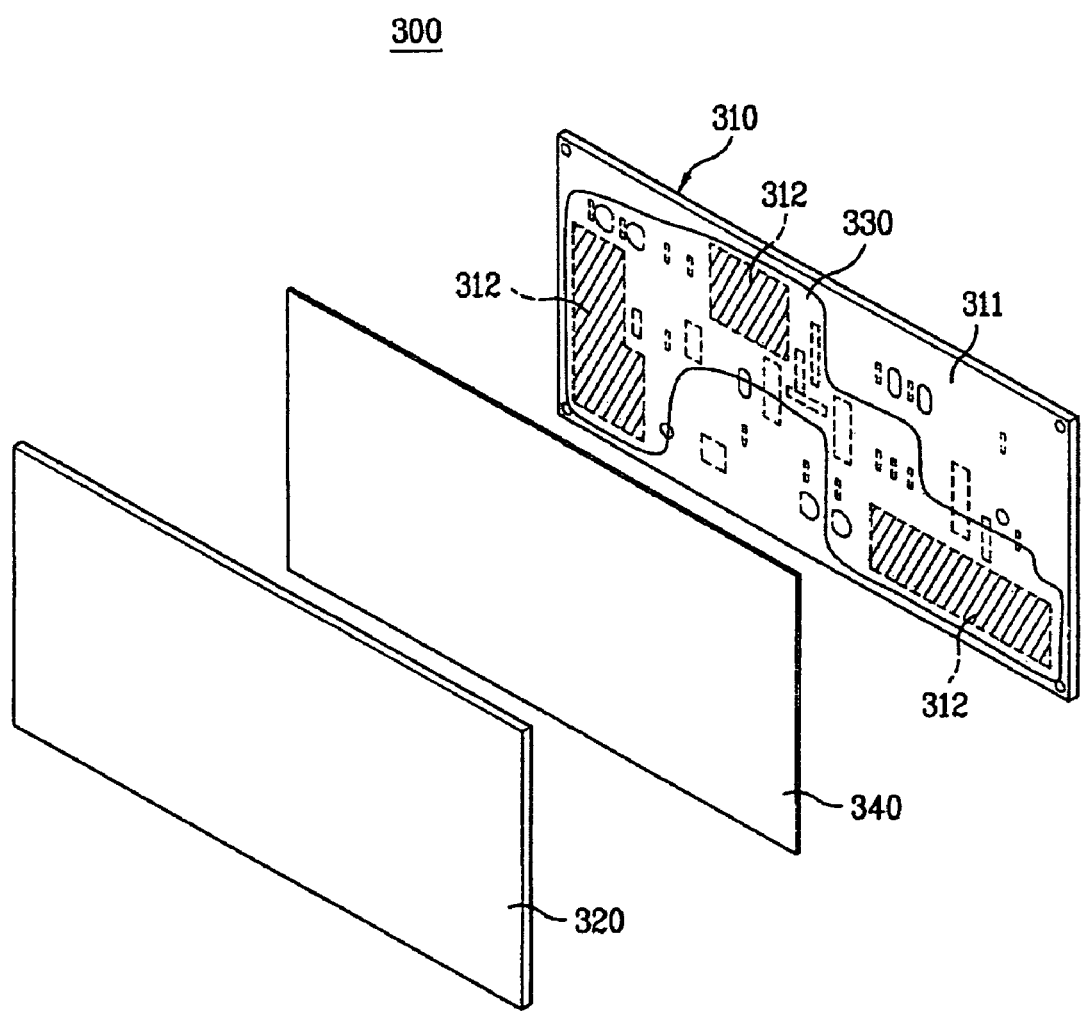
FIG. 3 is a perspective diagram of a circuit board module according to the present invention.

Referring to FIG. 3, a circuitry supporting substrate module (which relates to a circuitry supporting substrate applicable to both of the main circuitry supporting substrate module and the display module) includes a circuit board 310 on which devices for information processing are mounted and a reinforcement member 320 attached to the circuit board 310 to reinforce rigidity of the circuit board 310 and extend a ground area.

A conductive adhesive member 340, which has good electrical conductivity, is provided between the circuit board 310 and the reinforcement member 320 to enable the reinforcement member 320 to adhere to the circuit board 310 and to be electrically connected to a conductive area of the circuit board 310. The reinforcement member 320 is attached to the circuit board 310 to reinforce mechanical rigidity of the circuit board 310 and is formed of a conductor entirely or in part. As a result, a ground area of the circuit board can extend to the reinforcement member 320.

A printed circuit board (PCB) as an example of the circuit board 310 is explained as follows.

First of all, in the circuit board 310, a metal film (e.g., Cu film) is provided within a prescribed insulator and the metal film is exposed in an area where circuit lines are formed. Prescribed devices are connected to portions of the circuit board where the circuit lines are formed and the rest of the circuit board excluding the device-connected portions configures a strip portion 312 where the metal film is exposed by stripping the insulator.

By connecting the strip portion 312 to the reinforcement member 320 electrically, a ground area of the circuit board 310 can extend to the reinforcement member 320. Thus, a ground space can be maximized.

Figure 4:
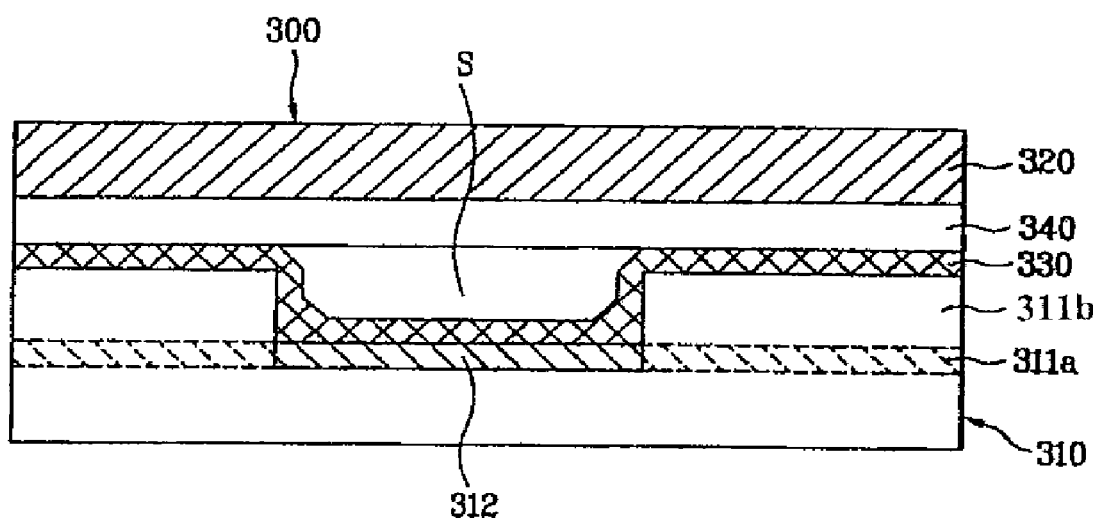
FIG. 4 is a cross-sectional diagram of a circuit board module according to the present invention.

The above configuration of the circuit board 310 is illustrated in detail in a cross-section of the circuit board 310 shown in FIG. 4. The circuit board 310, as shown in FIG. 4, includes a body portion 311 including a metal film 311a and an insulator 311b enclosing the metal film 311a and a strip portion 312 formed by stripping off the insulator 311b on a partial area of the body portion 311.

The strip portion 312 is recessed since the insulator of the body portion 311 is stripped off. In particular, the strip portion 312 is recessed inside the circuit board 310. Since the conductive adhesive member 340 is unable to completely contact the strip portion 312, a conductive coating material 330 is coated on a periphery of the strip portion 310 of the circuit board 310 to secure a ground area of the circuit substrate 310. The conductive adhesive member 340 and the reinforcement member 320 are attached to the conductive coating material 330 in order.

By coating the conductive coating material 330 on a surface of the strip portion 312 of the circuit board 310, the strip portion 312, as shown in FIG. 4, is able to be electrically connected to the reinforcement member 320 to maximize the ground area despite a space (S) formed between the strip portion 312 and the conductive adhesive member 340.

In particular, the strip portion 312 is formed to expose the metal film 311a by striping off the insulator 311b in the partial area of the circuit board 310 and the conductive coating material 330 is coated on the surface where the strip portion 312 is formed. Alternatively, the conductive coating material 330 can be coated on the entire surface of the strip portion 312 of the circuit board 310. Preferably, the conductive coating material 330 is mainly coated on the area of the strip portion 312 and a peripheral area of the strip portion 312, the conductive adhesive member 340 is attached to the conductive coating material 330, and the reinforcement member 320 is attached to the conductive adhesive member 340.

The conductive coating material 330 includes a conductive paste (mainly, silver paste) formed of resin mixed with conductive powder, conductive particles, conductive nano-particles or the like, conductive pigments of mixed materials, a conductive coating agent or the like. The conductive coating material 330 can be spread very thin. As a result, if the conductive coating material 330 is applied to mobile terminal, the mobile terminal can be made slimmer while providing improvement in reducing static electricity While reference has been made to a printed circuit board, it is understood that this arrangement can be provided on other circuitry supporting substrates.

A display module according to the present invention is explained with reference to FIGS. 5 to 8 as follows.

Figure 5:
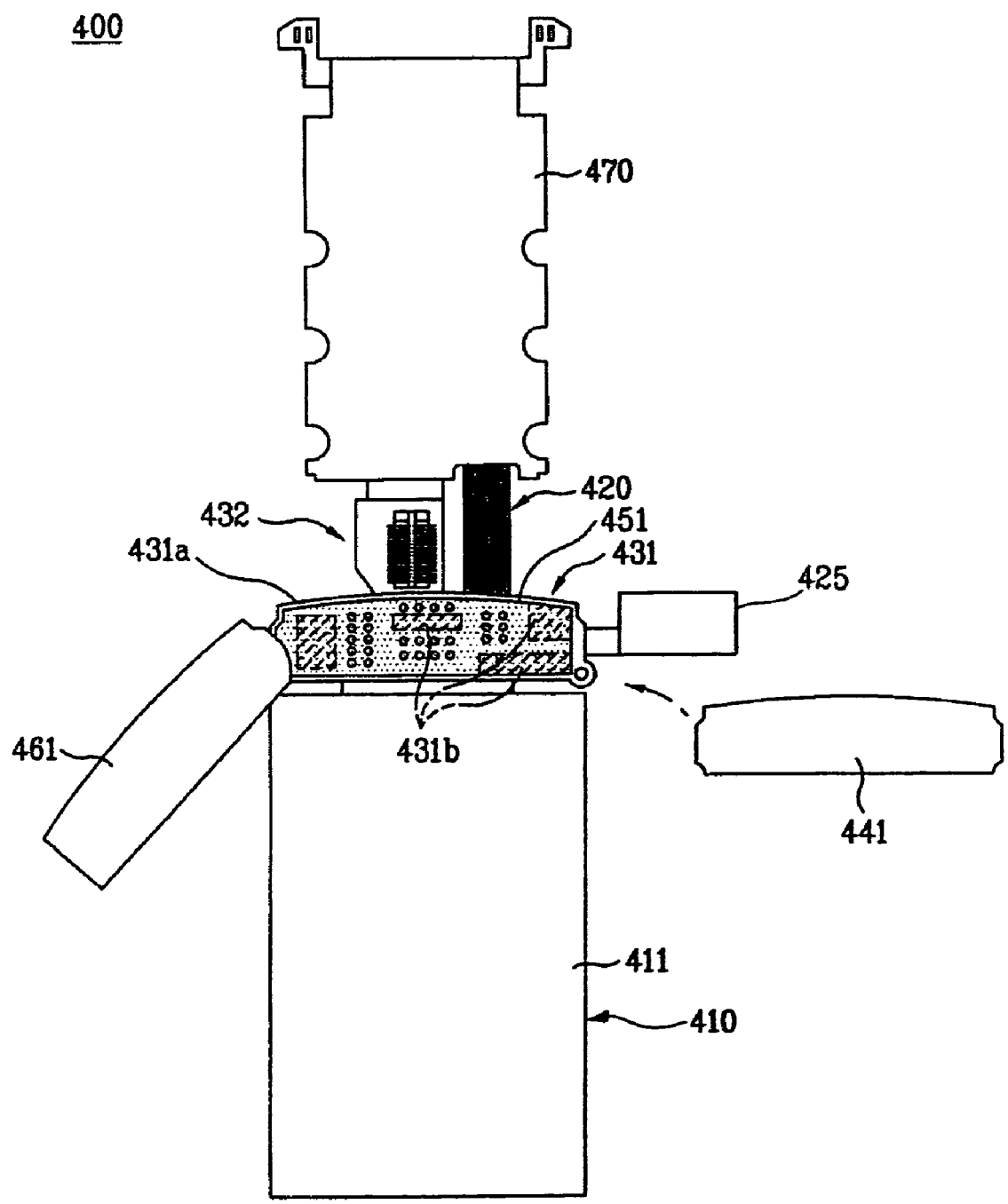
FIG. 5 is a layout of a display module according to the present invention.

Referring to FIG. 5, a display module 400 according to the present invention includes an LCD module 410, including LCD screen 411, representing prescribed information as an image output, a flexible circuitry supporting substrate module 420 for signal transfer to the LCD module 410 and prescribed information processing, a first circuitry supporting substrate 431 and a connector 432 connected to the flexible circuitry supporting substrate module 420. The connector 432 connects the flexible circuitry supporting substrate module 420 to the main circuitry supporting substrate module 300.

Mechanical rigidity of the LCD module 410 is vulnerable. If small static electricity is applied to the LCD module 410, an outputted image is distorted. Therefore, in order to reduce the vulnerability of the LCD module 410, a conductive reinforcement plate 470 is attached thereto. Hence, the mechanical rigidity of the LCD module 410 is reinforced and the vulnerability to the static electricity is compensated for. A specific description regarding the conductive reinforcement plate 470 will discussed below in greater detail below.

The first circuitry supporting substrate 431 includes a body portion 431a and a strip portion 431b formed in a partial area of the body portion 431a. The details corresponding to the body portion 431 and the strip portion 431b are equivalent to those described in FIG. 3 and FIG. 4 for printed circuit board 310.

A first coating material 451 is coated on a surface where the strip portion 431b of the first circuitry supporting substrate 431 is formed. A conductive adhesive member 461 is attached onto the first coating material 451. A first reinforcement member 441 is then attached onto the conductive adhesive member 461.

The first coating material 451 includes a conductive paste, conductive pigments, a conductive coating agent or the like. The first reinforcement member 441 functions as rigidity reinforcement, ground area extension and the like. The first reinforcement member 441 maximizes an electrical contact area between the first circuit board 431 and the first reinforcement member 441.

Figure 6:
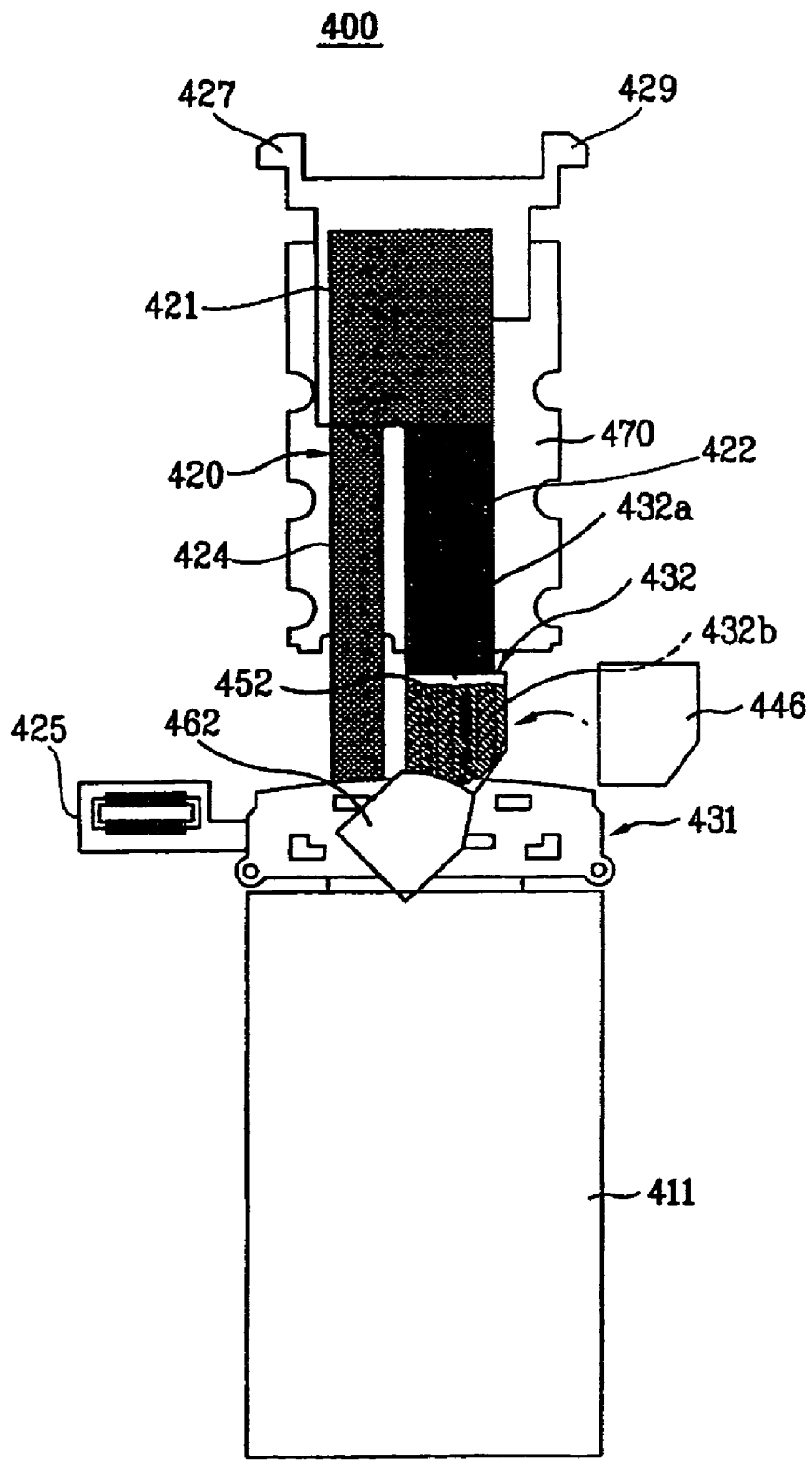
FIG. 6 is a layout of the other side of the display module shown in FIG. 5.

FIG. 6 shows a backside of the display module 400 shown in FIG. 5, in which connector 432 is connected to the FPCB module 420. Specifically, the connector 432 is the part connected to the main circuitry supporting substrate module 300 in the mobile terminal shown in FIGS. 1 and FIG. 2.

The connector 432 includes a body portion 432a and a strip portion 432b. A second coating material 452 is coated on a surface where the strip portion 432b is formed. A conductive adhesive member 462 is attached onto the second coating material 452. A second reinforcement member 442 is then attached onto the conductive adhesive member 462.

With regards to FIGS. 5-8, the FPCB module 420 includes a first signal line 422 connected to the main circuitry supporting substrate module 300 via connector 432 to exchange prescribed signals therewith, a second signal line 424 connected to the first circuitry supporting substrate 431 (also referred to as a second key input part), which will be described in more detail below, connected to the connection circuit part 412 of the LCD module 410 to exchange prescribed signals therewith, and a signal processing part 421 connected to each of the first and second signal lines 422 and 424 to manage and handle the signals from the respective signal lines 422, 424.

The conductive reinforcement member 470 is attached between the LCD module 410 and the flexible circuitry supporting substrate module 420. As a result, the LCD screen 411, the conductive reinforcement member 470, and the flexible circuitry supporting substrate module 420 are attached together and may be attached to an inner wall side of the second body 200, as shown in FIGS. 1 and 2. In this case, by providing a conductive adhesive member 463 to a backside of the flexible circuitry supporting substrate module 420, the conductive reinforcement member 470 and the conductive adhesive member 463 are able to extend an overall ground area similar to that provided for the main circuitry supporting substrate module 300, the first circuitry supporting substrate 431, and the connector 432.

In particular, the signal processing part includes a body portion 421a and a strip portion 421b formed in a partial area of the body portion 421a. The details corresponding to the body portion 431 and the strip portion 431b are equivalent to those described in FIG. 3 and FIG. 4 for printed circuit board 310.

A third coating material 453 is coated on a surface where the strip portion 421b of the signal processing part 421 is formed. A conductive adhesive member 463 is attached onto the third coating material 453. The conductive reinforcement member 470 is then attached onto the conductive adhesive member 463 such that the signal generating part 421 is sandwiched between the conductive adhesive member 463 and the conductive reinforcement member 470.

The third coating material 453 includes a conductive paste, conductive pigments, a conductive coating agent or the like. The conductive reinforcement member 470 functions as rigidity reinforcement, ground area extension and the like.

Having generally described features of the mobile terminal, more specific details are provided with reference to FIGS. 1 and 2.

The first body 100 includes the main circuitry supporting substrate module 300 and a first key input part 103 provided to a lower side of the main circuitry supporting substrate module 300 for a key input from a first key pad 105.

The second body 200 includes the LCD screen 411, the conductive reinforcement member 470 adhering closely to a backside of the LCD screen 411, and the flexible circuitry supporting substrate module 420 attached to a backside of the conductive reinforcement member 470. In the vicinity of a lower end side of the LCD screen 411, the second body 200 further includes the first circuitry supporting substrate (second key input part) 431 for a key input by a second keypad 104 and a conductive reinforcement plate 441 attached to a backside of the first flexible circuitry supporting substrate 431 to reinforce rigidity.

The first signal line 422 of the flexible circuitry supporting substrate module 420 runs across a boundary between the second and first bodies 200 and 100 to be connected to the main circuitry supporting substrate module 300. The connector 432 is provided to an end portion of the first signal line 422 to allow for connection to the main flexible circuitry supporting substrate module 300. The second signal line 424 is connected to the first circuitry supporting substrate 431 to be finally connected to the LCD screen 411.

Referring to FIGS. 5 and 6, the flexible circuitry supporting substrate module 420 configuring a display module 400 according to the present invention includes the first signal line 422, the second signal line 424 and the signal processing part 421 connected to the first and second signal lines 422 and 424 to process signals. The flexible circuitry supporting substrate module 420 further includes the first circuitry supporting substrate 431 connected to the second signal line 424 and a connection connector 425 connecting the LCD module 410 to the first circuitry supporting substrate 431.

In the vicinity of an upper end of the signal processing part 421, a speaker connecting part 427 for connection to a speaker of mobile terminal and a motor connecting part 429 connected for connection to a motor are provided.

The connector 432 is provided to an end portion of the first signal line 422 to access the main circuitry supporting substrate module 300. The reinforcement plate 441 is formed of a conductive material for a ground for static electricity generated from the first circuitry supporting substrate 431 and the like is provided on one side of the first circuitry supporting substrate 431 to reinforce rigidity of the first circuitry supporting substrate 431.

Figure 7:
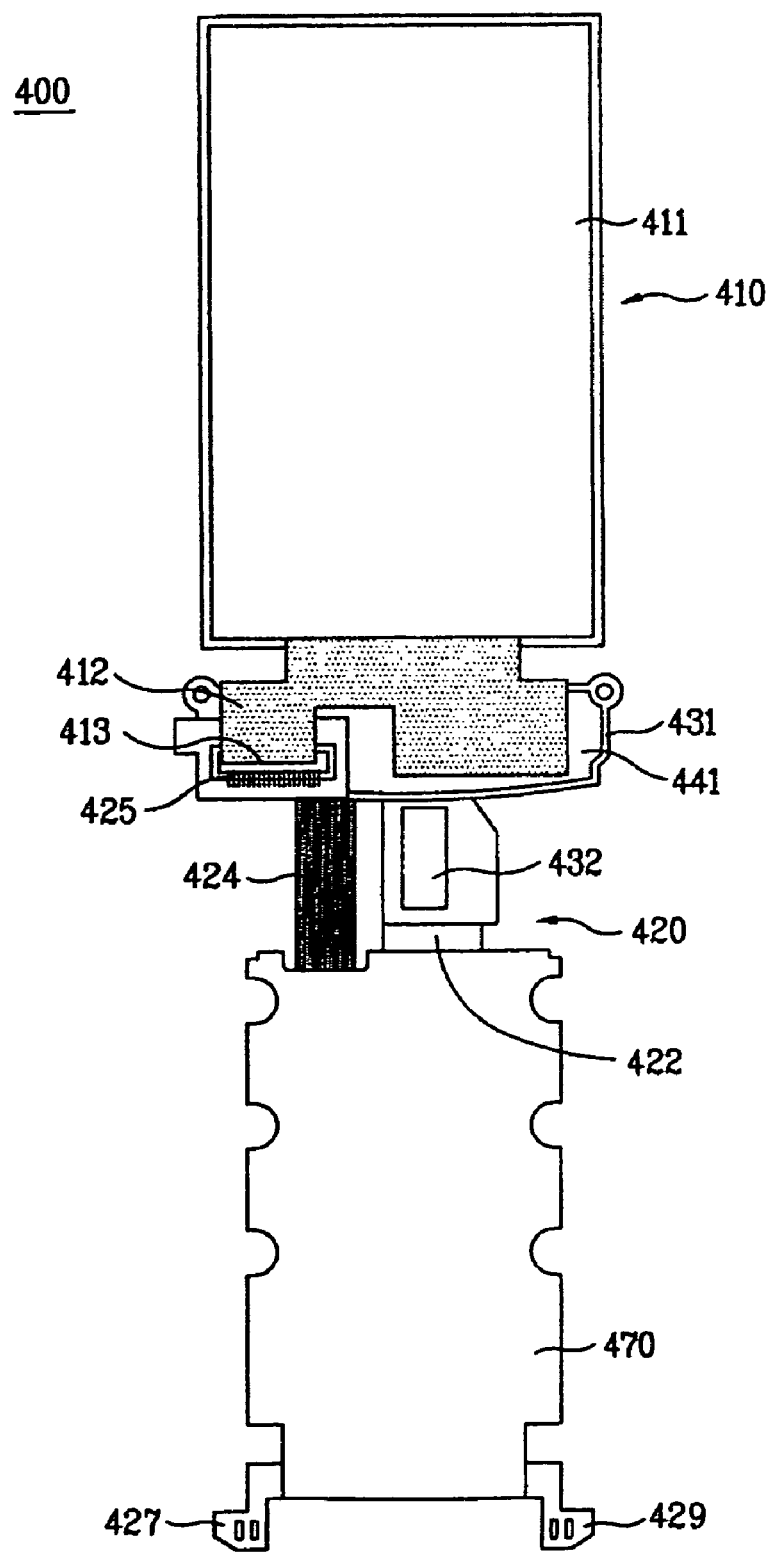
FIG. 7 is a layout of the display module of FIG. 5 with some of its components connected.
Figure 8:
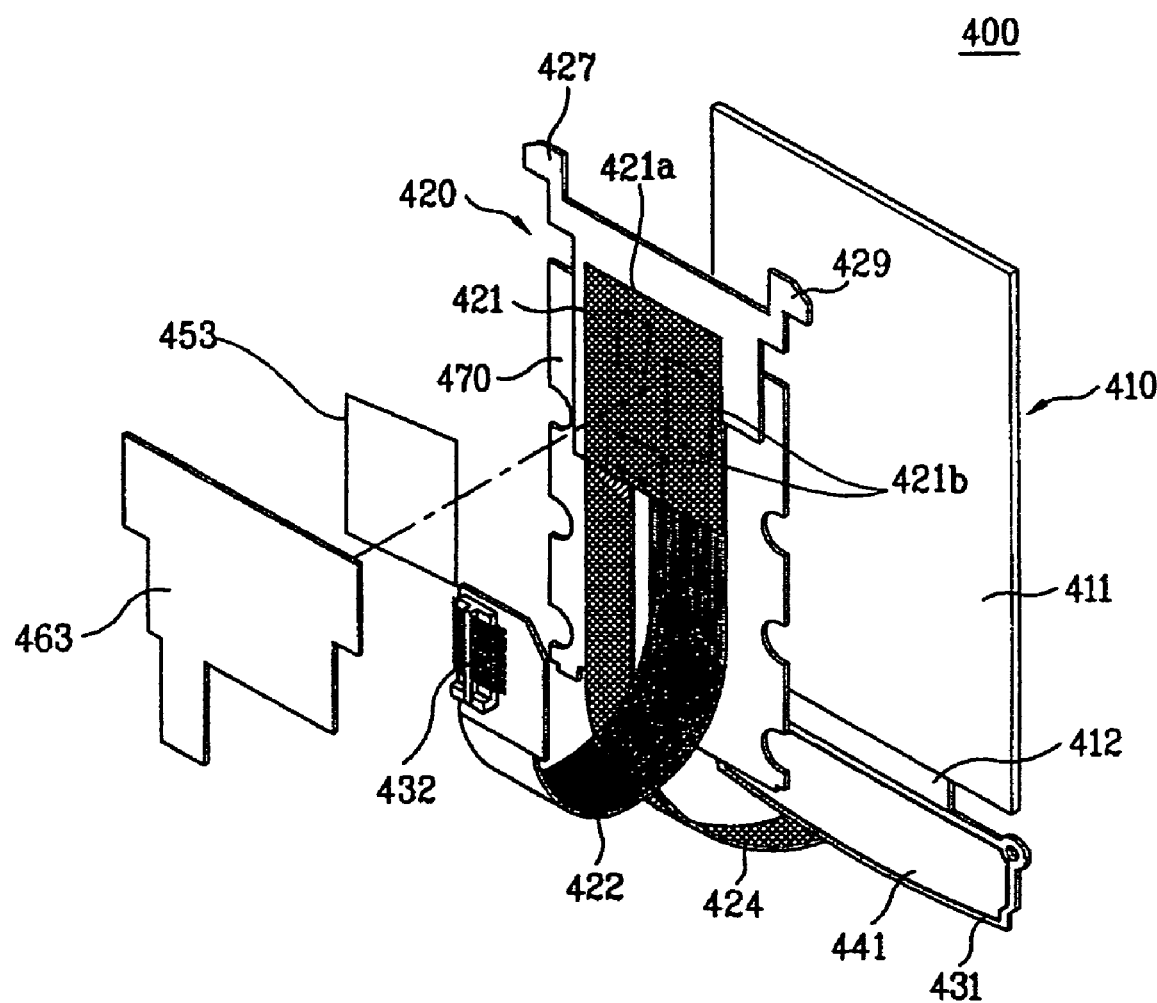
FIG. 8 is a perspective diagram of the display module of FIG. 5.

With reference to FIGS. 7 and 8 the display module 400 includes a connecting device 413 provided to a connecting circuit part 412 of the LCD module 410 is connected to a connection connector 425 of the first circuitry supporting substrate 431 of the flexible circuitry supporting substrate module 420, whereby the LCD module 410 and the flexible circuitry supporting substrate module are electrically connected together.

The conductive reinforcement member 470 is formed of a conductive substance, i.e., conductive materials entirely or in part. If a thickness or size of the conductive reinforcement member 470 is increased, a ground area can be extended. Yet, since limitation is put on an overall thickness and size of an apparatus for mobile communication, the thickness and size of the conductive reinforcement member 470 are preferably maximized within a range to avoid considerable influence on the overall thickness and size of the apparatus only. Preferably, the size of the conductive reinforcement member 470 is formed substantially equal to or slightly greater than a size of the LCD screen 411.

By inserting the conductive reinforcement member 470 between the LCD module 410 and the flexible circuitry supporting substrate module 420 and to be attached or adhere closely in-between, static electricity carried via the LCD screen 411 and the flexible circuitry supporting substrate module 4210 is transferred to the conductive reinforcement member 470 to disperse. As a result, it is able to lower an electric field within the mobile terminal. It is able to prevent the LCD screen 411 from being affected by the static electricity. In addition, it is able to protect the LCD screen 411 from an external force and the like in a manner of reinforcing the rigidity of the LCD screen 411.

When the display module 400 is attached to the mobile terminal via the conductive adhesive member 463, a ground area can be more extended because the conductive adhesive member 463 contains a prescribed conductive component. Furthermore, by providing the third coating material 453 as described above, the connection of the conductive adhesive member 463 to the conductive reinforcement member 470 is enhanced.

Similarly, by providing the conductive reinforcement plate 441 to the first circuitry supporting substrate 431 and the conductive reinforcement plate 442 to the connector 432, respective ground areas can be further extended. Hence, the influence of the static electricity can be considerably lowered.

Accordingly, the present invention provides the following effects or advantages.

Namely a ground area can be extended sufficient to lower influence of internal and external static electricity put on an apparatus for mobile communication. As a result, internal parts of the mobile terminal and more particularly, an LCD screen can be protected against the static electricity. In addition, mechanical rigidity of the LCD screen can be reinforced, simultaneously. Hence, the present invention is able to provide a reliable use environment of the mobile terminal to a user.

More generally, the present invention maximizes a ground area of a circuitry supporting substrate by reinforcing rigidity of the vulnerable circuitry supporting substrate, thereby reducing influence of static electricity or the like to enhance reliability of the mobile terminal or display assembly.

In addition, to further enhance the ground area of the main board 300 and the display module 400, the backside of the first body 100 and a metal or conductive coating material may be coated on an inside of a portion of the second body 200 adjacent to the first body 100 to come into contact with the display module 400, respectively (not shown for clarity). Hence, the ground area can be further extended for both the main board 300 and the display module 400.

The invention thus being described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A display assembly comprising:
   a display module to receive a display signal containing prescribed information;
   a main circuitry supporting substrate including a ground;
   a flexible circuitry supporting substrate module connected to the main circuitry supporting substrate to process or transfer data for prescribed information from the main circuitry supporting substrate to the display module, the flexible circuitry supporting substrate module having at least one recessed exposed conductive portion; and
   a conductive member connected to the flexible circuitry supporting substrate module to ground the flexible circuitry supporting substrate module and the display module, the conductive member including:
      conductive tape applied to the flexible circuitry supporting substrate module, and
      conductive paste to connect the at least one recessed exposed conductive portion of the flexible circuitry supporting substrate module to the conductive tape.

2. The display assembly of claim 1, the flexible circuitry supporting substrate module comprising:
   a first signal line connected to a main circuitry supporting substrate;
   a second signal line connected to the display module; and
   a signal processing part connected to the first and second signal lines to manage and process signals.

3. The display assembly of claim 1, the display module comprising:
   a connecting circuit part connected to the flexible circuitry supporting substrate module to transfer data for prescribed information; and
   a screen on which the information transferred from the connecting circuit part is displayed.

4. The display assembly of claim 1, wherein the conductive member includes:
   a conductive reinforcement member,
   the conductive tape attaches the conductive reinforcement member to the conductive paste coated on the flexible circuitry supporting substrate module, and
   the conductive tape electrically connects the at least one recessed exposed conductive portion of the flexible circuitry supporting substrate module and the conductive paste with the conductive reinforcement member.

5. The display assembly of claim 2, the flexible circuitry supporting substrate module further comprising:
   a key input part configured to receive a key input from a keypad, the key input part being connected to the second signal line and the display module to transfer data of the second signal line to the display module; and
   a reinforcement member connected to the key input part, the reinforcement member being at least partially formed of conductive materials to enable the display module and the flexible circuitry supporting substrate module to be grounded.

6. The display assembly of claim 5, wherein the screen is a liquid crystal display.

7. A mobile terminal comprising:
   a first body having a main circuitry supporting substrate located therein;
   a second body performing a relative motion against the first body to open/close the first body; and
   a display assembly including:
      a display module to receive a display signal containing prescribed information;
      a circuitry supporting substrate including a ground;
      a flexible circuitry supporting substrate module connected to the main circuitry supporting substrate to process or transfer data for prescribed information from the main circuitry supporting substrate to the display module, the flexible circuitry supporting substrate module having at least one recessed exposed conductive portion; and
      a conductive member connected to the flexible circuitry supporting substrate module to ground the flexible circuitry supporting substrate module and the display module, the conductive member including:
         conductive tape applied to the flexible circuitry supporting substrate module, and
         conductive paste to connect the at least one recessed exposed conductive portion of the flexible circuitry supporting substrate module to the conductive tape.

8. The mobile terminal of claim 7, the flexible circuitry supporting substrate module comprising:
   a first signal line connected to the main circuitry supporting substrate;
   a second signal line connected to the display module; and
   a signal processing part connected to the first and second signal lines to manage and process signals.

9. The mobile terminal of claim 7, the display module comprising:
   a connecting circuit part connected to the flexible circuitry supporting substrate module to transfer data for prescribed information; and
   a screen on which the information transferred from the connecting circuit part is displayed.

10. The mobile terminal of claim 7, wherein the conductive member includes:
    a conductive reinforcement member,
    the conductive tape attaches the conductive reinforcement member to the conductive paste coated on the flexible circuitry supporting substrate module, and
    the conductive tape electrically connects the at least one recessed exposed conductive portion of the flexible circuitry supporting substrate module and the conductive paste with the conductive reinforcement member.

11. The mobile terminal of claim 8, the flexible circuitry supporting substrate module further comprising:
    a key input part configured to receive a key input from a keypad, the key input part being connected to the second signal line and the display module to transfer data of the second signal line to the display module; and
    a reinforcement member connected to the key input part, the reinforcement member being at least partially formed of conductive materials to enable the display module and the flexible circuitry supporting substrate module to be grounded.

12. The mobile terminal of claim 9, wherein the screen is a liquid crystal display.

13. A mobile terminal comprising:
    a first body;
    a second body configured to open and close the first body; and
    a circuitry supporting substrate module provided within at least one of the first and second bodies, the circuitry supporting substrate module including:
       a circuitry supporting substrate having at least one recessed exposed conductive area; and
       a conductive member connected to the circuitry supporting substrate to ground the circuitry supporting substrate, the conductive member including:
          conductive tape applied to the circuitry supporting substrate, and
          conductive paste to connect the at least one recessed exposed conductive area of the circuitry supporting substrate to the conductive tape.

14. The mobile terminal according to claim 13, wherein the circuitry supporting substrate is a main circuitry supporting substrate, and the mobile terminal further comprising a display assembly including:

a display module to receive a display signal containing prescribed information;

a flexible circuitry supporting substrate module connected to the main circuitry supporting substrate to process or transfer data for prescribed information from the main circuitry supporting substrate to the display module, the flexible circuitry supporting substrate module having at least one recessed exposed conductive portion; and a second conductive member connected to the flexible circuitry supporting substrate module to ground the flexible circuitry supporting substrate module and the display module, the second conductive member including:
  conductive tape applied to the flexible circuitry supporting substrate module, and
  conductive paste to connect the at least one recessed exposed conductive portion of the flexible circuitry supporting substrate module to the conductive tape.

15. The mobile terminal of claim 14, the flexible circuitry supporting substrate module comprising:

a first signal line connectable to the main circuitry supporting substrate;

a second signal line connected to the display module; and a signal processing part connected to the first and second signal lines to manage and process signals.

16. The mobile terminal of claim 15, the flexible circuitry supporting substrate module further comprising:

a key input part configured to receive a key input from a keypad, the key input part being connected to the second signal line and the display module to transfer data of the second signal line to the display module; and a reinforcement member connected to the key input part, the reinforcement member being at least partially formed of conductive materials to enable the display module and the flexible circuitry supporting substrate module to be grounded.

17. The mobile terminal of claim 15, the display module comprising:

a connecting circuit part connected to the flexible circuitry supporting substrate module to transfer data for prescribed information; and a screen on which the information transferred from the connecting circuit part is displayed.

18. The mobile terminal of claim 17, wherein the screen is a liquid crystal display.

19. The mobile terminal of claim 15, wherein the conductive member includes:

a conductive reinforcement member, the conductive tape attaches the conductive reinforcement member to the conductive paste coated on the flexible circuitry supporting substrate module, the conductive tape electrically connects the at least one recessed exposed conductive portion of the flexible circuitry supporting substrate module and the conductive paste with the conductive reinforcement member, and the at least one recessed exposed conductive portion of the flexible supporting substrate module is formed on the signal processing pail.

* * * * *